United States Patent [19]

Casto

[11] Patent Number: 5,172,214

[45] Date of Patent: Dec. 15, 1992

[54] LEADLESS SEMICONDUCTOR DEVICE AND METHOD FOR MAKING THE SAME

[75] Inventor: James J. Casto, Austin, Tex.

[73] Assignee: Motorola, Inc., Schaumburg, Ill.

[21] Appl. No.: 866,282

[22] Filed: Apr. 10, 1992

Related U.S. Application Data

[63] Continuation of Ser. No. 651,165, Feb. 6, 1991, abandoned.

[51] Int. Cl.$^5$ .................. H01L 23/28; H01L 21/56
[52] U.S. Cl. .................. 257/676; 437/211; 437/220; 437/902; 257/693; 257/796; 257/737
[58] Field of Search .................. 357/72, 68, 69, 70, 357/81; 437/211, 220, 902

[56] References Cited

U.S. PATENT DOCUMENTS

| | | | |
|---|---|---|---|
| 4,866,506 | 9/1989 | Nambu et al. | 357/72 |
| 4,890,152 | 12/1989 | Hirata et al. | 357/72 |
| 4,945,398 | 7/1990 | Kurita et al. | 357/72 |
| 4,992,850 | 2/1991 | Corbett et al. | 357/72 |
| 5,122,860 | 6/1992 | Kikuchi et al. | 357/72 |

*Primary Examiner*—Edward J. Wojciechowicz
*Attorney, Agent, or Firm*—Patricia S. Goddard

[57] ABSTRACT

A semiconductor device having a thin package profile is leadless, thereby minimizing necessary mounting space on a substrate. In one form, a semiconductor device has a semiconductor die electrically coupled to a plurality of conductive leads. Each lead has a first portion, a second portion, and an intermediate portion which separates the first and second portions. A package body encapsulates the semiconductor die and the first and intermediate portions of the leads. The second portions of the leads are exposed on the bottom surface of the package body and are used to electrically access the semiconductor die.

12 Claims, 1 Drawing Sheet

LEADLESS SEMICONDUCTOR DEVICE AND METHOD FOR MAKING THE SAME

This application is a continuation of prior application Ser. No. 07/651,165, filed Feb. 6, 1991, now abandoned.

CROSS-REFERENCE TO RELATED APPLICATION

This application is related to a commonly assigned co-pending patent application entitled, "SEMICONDUCTOR DEVICE HAVING DUAL ELECTRICAL CONTACT SITES AND METHOD FOR MAKING THE SAME," by McShane et al., Ser. No. 07/651,166, filed concurrently herewith.

TECHNICAL FIELD OF THE INVENTION

The present invention is related to semiconductor devices in general, and more specifically, to leadless semiconductor devices having thin package profiles and a method for making the same.

BACKGROUND OF THE INVENTION

In order to meet the demands of the growing electronics industry, semiconductor manufacturers are faced with many challenges in supplying suitable semiconductor devices. One challenge is to provide customers with very small, yet powerful, devices. However, this challenge is not easily met. Small devices are desirable because small devices require less mounting space on a substrate and have fewer problems with signal transmissions as compared to larger devices. At the same time, powerful devices are necessary in order to store and transmit a maximum amount of imformation. Yet as the power and performance of a device increases, the size of the device also increases. Much of this increase is due to a larger number of terminals, or leads, required to operate the device.

Keeping the size of a semiconductor device to a minimum is often achieved by using thin, fragile, densely spaced leads as electrical contacts to the device. However, the use of such leads creates a variety of manufacturing and handling problems. Handling devices with such fragile leads can result in bent and non-coplanar leads, making it difficult to properly mount the device to a substrate, such as a PC (printed circuit) board. Manufacturing devices with such closely spaced leads is itself difficult. Leadframes used in molded packages have a piece of metal, known as a dambar, to act as a dam for molding material. The dambar must be cut out from between the leads prior to using the device, usually by a punching operation. Closely spaced leads can be damaged by the punching operation. Furthermore, the small dimensions of a punching tool used for removing dambars from between fine leads make the punching tool susceptible to damage as well.

Although much of the effort devoted to reducing package size has concentrated on reducing the package width and length, it is also desirable for semiconductor devices to be thin, especially in consumer electronics applications. Therefore, a need exists for an improved semiconductor device, and more specifically for an improved semiconductor device which is leadless and has a thin package profile.

BRIEF SUMMARY OF THE INVENTION

The previously mentioned needs are fulfilled, and other advantages are achieved with the present invention. In one form, a semiconductor device has a semiconductor device die. The semiconductor device die is electrically coupled to a plurality of conductive leads. Each lead has a first portion and a second portion, the first portion being separated from the second portion by an intermediate portion. A package body encapsulates the semiconductor device die and first and intermediate portions of the plurality of conductive leads. The second portions of the plurality of conductive leads are exposed on an edge and a bottom surface of the package body.

DETAILED DESCRIPTION OF A PREFERRED EMBODIMENT

The present invention has several advantages over conventional semiconductor devices. One advantage is that a semiconductor device in accordance with the present invention is externally leadless. Most known devices have leads which are external to a package body. The presence of external leads requires that a device occupy more space on a substrate, such as a printed circuit board, than if the device had no external leads. Furthermore, the presence of leads generates handling and manufacturing problems as discussed earlier. Some known semiconductor devices are considered to be leadless, for example a leadless chip carrier (LCC). However, most LCCs are formed from a multilayer ceramic material, and therefore LCCs are quite expensive. An overmolded device is also leadless, but overmolded devices require a semiconductor die to be mounted onto a PC board prior to encapsulation. Since an overmolded device contains a portion of a PC board, the cost of the device is significantly increased.

Another advantage of the present invention is that a semiconductor device can be made very thin, up to half the thickness of many conventional devices. Thin semiconductor devices are a competitive advantage in the consumer market for such applications as smart cards, cellular telephones, and pagers. Yet another advantage is that the present invention also allows a semiconductor device to have good heat dissipation, without increasing the size of the device. Heat dissipation is an important concern in high performance and high power consumption devices. Most methods of removing heat from a device, such as using heat sinks, increase the size of the device. The present invention can effectively dissipate heat without an increase in device size.

Figure 1:
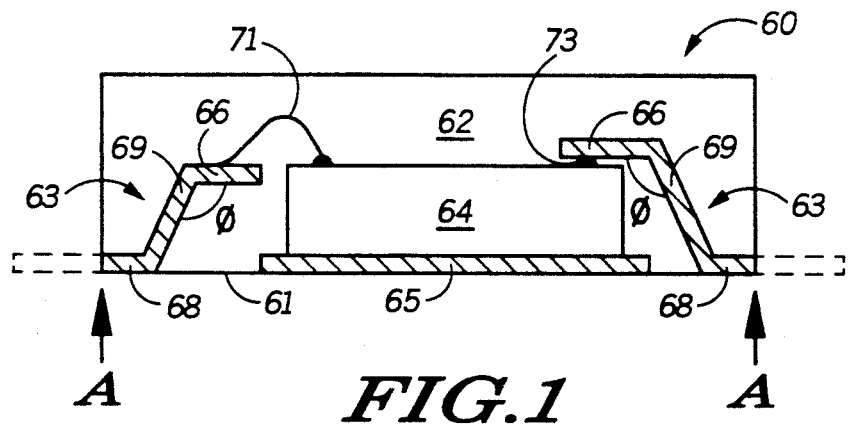
FIG. 1 illustrates, in cross-section, an embodiment of a semiconductor device in accordance with the present invention.

Illustrated in FIG. 1 is a semiconductor device 60 in accordance with the present invention. Device 60 has a semiconductor device die 64 which is usually an integrated circuit. Also included in device 60 is a leadframe (not entirely shown) having a plurality of leads 63 and a die receiving area 65 also known as a die pad or flag. Conventional leadframe materials, such as copper, copper alloys, iron-nickel alloys, or TAB (tape automated bonding) leadframes, are suitable for use with the present invention. Semiconductor device die 64 is positioned at die receiving area 65, typically using an adhesive material, and is electrically coupled to the plurality of leads 63. The left portion of device 60 illustrated in FIG. 1 uses a wire bond 71 to couple a lead to the die, whereas the right portion of device 60 illustrates use of a TAB bond 73 or other type of lead-on-chip bond. Usually a semiconductor device contains only one type of coupling technique. The device of FIG. 1 has two different coupling techniques solely for illustrative purposes.

Device 60 is approximately one-half the thickness of a conventional molded semiconductor device. Most semiconductor devices have a package body which extends both above and below a plurality of leads of a leadframe. The device illustrated in FIG. 1 is thinner than many known devices because a protective package body 62 is formed only above the plurality of leads 63 of the leadframe. This is accomplished by forming the package in a one-sided mold tool or a mold tool having one planar platen. Typically, molded semiconductor device packages are formed in mold tools having an upper and a lower platen, each platen having a cavity. The platens are brought together such that the two cavities form a larger cavity which surrounds a semiconductor device die and inner portions of leads of a leadframe. An encapsulating material is introduced into the larger cavity to form a package body which completely surrounds a die and inner portions of the leads. The package body extends both above and below the die and the leads. Device 60, on the other hand, has package body 62 only formed above the leads 63 and semiconductor device die 64.

In accordance with the present invention, the leads 63 of device 60 in FIG. 1 have first portions 66, second portions 68, and intermediate portions 69. Second portions 68 of leads 63 are exposed on a bottom surface 61 of package body 62 and on the sides of the package body. Upon forming package body 62 about semiconductor device die 64, leads 63 will extend from the package body, as illustrated by the dashed lines in FIG. 1. The leads may then be formed into standard lead configurations, such as gull-wing, J-lead, through-hole, or the like. Preferably, leads 63 are severed at points A to create a leadless semiconductor device. Electrical contact to the semiconductor device is made through the second portions exposed on bottom surface 61 of the package.

As illustrated in FIG. 1, first portions 66 of leads 63 are portions of the leads which are electrically coupled to semiconductor device die 64. In the case of wire bond coupling, it is advantageous to have the bonding surface of a lead in the same plane as the bonding surface of the die. Naturally for the TAB bond illustrated, one surface must lie just above the other. Lead-on chip bonding may also be used in accordance with the present invention. Intermediate portions 69 of the leads are portions of the leads which join first portions 66 and second portions 68. In order to have the second portions of the leads exposed on the bottom surface of the package, yet have first portions coupled to the die, intermediate portions are at an angle with respect to both the first and second portions. For example, intermediate portions 69 of FIG. 1 are at an angle $\phi$ from first portions 66. Suitable angles for use with the present invention are substantially in the range of 90°-150°, although other obtuse angles could be used.

FIG. 1 also illustrates that die receiving area 65 is exposed on the bottom surface 61 of package body 62. Having the die receiving area, also referred to as a flag, exposed on a surface of the package improves the thermal performance of the device. Heat is conducted from semiconductor device die 64 through die receiving area 65 to the ambient, thereby reducing the temperature of the device.

Figure 2:
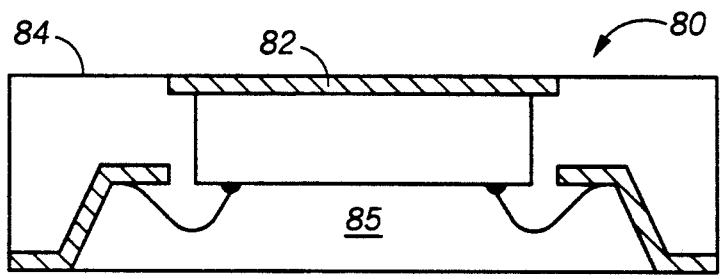
FIG. 2 illustrates, in cross-section, another embodiment of a semiconductor device in accordance with the present invention.

To further enhance thermal performance, a die receiving area could be exposed on the top surface of the package body. Because the bottom surface of the package is adjacent to a substrate, such as a PC board, heat dissipation can be improved by removing heat through the top surface of the package rather than through the bottom surface. A semiconductor device 80, illustrated in FIG. 2, in accordance with the present invention, has a die receiving area 82 exposed on a top surface 84 of a package body 85. Device 80 has a thin package profile similar to the device illustrated in FIG. 1, yet has the added benefit of allowing heat to dissipate from a top surface which will be more exposed to the ambient.

A semiconductor device in accordance with the present invention, such as device 60 of FIG. 1, can be mounted to a substrate, such as a printed circuit board, like other leadless devices. For example, a PC board is screen printed with a solder paste in a pattern which corresponds to the pattern of the exposed second portions of the leads. The device is then appropriately positioned on the PC board and the solder is reflowed. For more reliable board mounting, the exposed portions of the leads of the device can be pretinned or solder plated prior to mounting the device. This improves the wettability of the exposed portions of the leads and provides better coupling to the screen printed solder on the substrate. An alternative method of mounting a device in accordance with the present invention is with the use of solder balls. Solder balls could be attached to the exposed portions of the leads and then coupled to a substrate at a later point.

Figure 3:
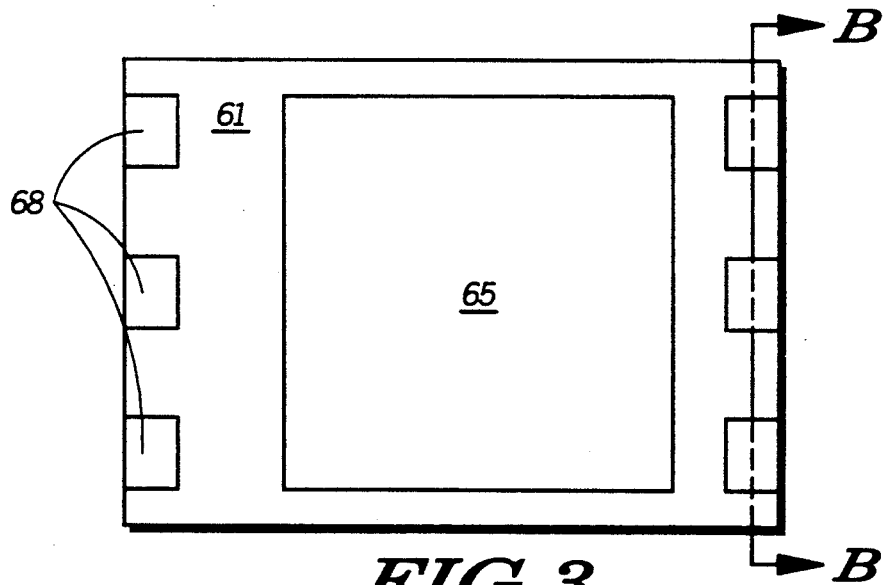
FIG. 3 illustrates, in planar view, the bottom surface of the semiconductor device of FIG. 1.
Figure 4:
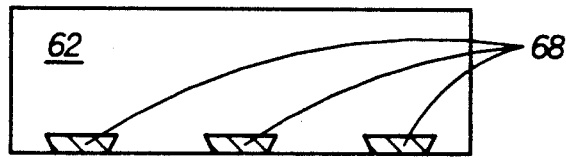
FIG. 4 illustrates, in cross-section, a view of the semiconductor device of FIG. 3 taken along the line B—B.

Illustrated in FIG. 3 is a bottom perspective of the semiconductor device illustrated in FIG. 1. Die receiving area 65 is exposed on bottom surface 61 of the package body. Also exposed on bottom surface 61 are second portions 68 of the leads. Second portions 68 are used to electrically access the semiconductor die (not shown) and are usually electrically coupled to a substrate, for example, by solder, solder balls, gold bumps, or the like. A cross-section of second portions 68 taken along the line B—B of FIG. 3 is illustrated in FIG. 4. The cross-sectional shape of second portions 68 is illustrated as being trapezoidal. While a trapezoidal shape is not an essential aspect of the present invention, it may be helpful to have a lead shape which secures or locks the leads into place in package body 62. Because more of the lead is exposed on the surface of the package than in conventional semiconductor devices, added features to keep leads in place may be necessary.

Thus it is apparent that there has been provided, in accordance with the invention, a leadless semiconductor device and a method for making the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in packages having one semiconductor die, but may also be used with multiple component semiconductor devices. Nor is it necessary that a device in accordance with the invention have an exposed die receiving area. Furthermore, the invention is not limited to using the electrical coupling methods described or illustrated. Likewise, any method of mounting a semiconductor device having a structure in accordance with the invention is suitable. It is not intended that the invention be limited to the substrate mounting techniques described. Therefore, it is intended that this invention encompass all such variations and modifications as fall within the scope of the appended claims.

I claim:

1. A leadless semiconductor device comprising:
   a leadframe having a die receiving area and a plurality of leads extending outwardly from positions adjacent the die receiving area, each of the leads having first and second portions and an intermediate portion, the first portion of each lead being closer to the die receiving area than the second portion, and each of the first and second portions being separated by the intermediate portion thereof;
   a semiconductor die positioned at the die receiving area of the leadframe and electrically coupled to the plurality of leads; and
   a package body having a top surface, a bottom surface, and a perimeter, wherein the semiconductor die, the plurality of leads, and the die receiving area are completely contained within the package body and wherein a first surface of each of the second portions of the leads and an entire surface of the die receiving area are exposed on and substantially flush with one of either the top surface or bottom surface of the package body.

2. The semiconductor device of claim 1 wherein a second surface of each of the second portions of the leads is exposed on and substantially flush with the perimeter of the package body and wherein only the first and second surfaces of the leads are exposed.

3. The semiconductor device of claim 1 further comprising means for electrically coupling the second portions of the leads exposed on the bottom surface of the package body to a substrate.

4. The semiconductor device of claim 3 wherein the means for electrically coupling the second portions of the leads to a substrate comprises solder.

5. A leadless semiconductor device comprising:
   a semiconductor die;
   a plurality of conductive leads electrically coupled to the semiconductor die, each lead having a first portion for electrical connection to the die and a second portion for subsequent electrical connection to the device, the second portion being separated from the first portion by an intermediate portion; and
   a molded package body completely containing the semiconductor die and the plurality of conductive leads wherein a first surface of each second portion is exposed on, and substantially flush with, a side of the package body and a second surface of each second portion is exposed on, and substantially flush with one of either a top surface or a bottom surface of the package body and wherein only the first and second surfaces of the leads are exposed.

6. The semiconductor device of claim 5 further comprising a die receiving area for receiving the semiconductor die and wherein a surface of the die receiving area is exposed on and flush with one of either a top surface of the package body or the bottom surface of the package body.

7. The semiconductor device of claim 5 wherein the first portions of the leads and the second portions of the leads are positioned in substantially parallel planes.

8. The semiconductor device of claim 5 wherein the first portion of each of the plurality of leads intersects the intermediate portion at an obtuse angle.

9. A method for fabricating a leadless semiconductor device comprising the steps of:
   providing a semiconductor die;
   providing a leadframe having a die receiving area and a plurality of leads extending outwardly from positions adjacent the die receiving area, each of the leads having first and second portions and an intermediate portion, the first portion being closer to the die receiving area than the second portion, and the first and second portions being separated by the intermediate portion;
   electrically coupling each first portion of the plurality of leads to the semiconductor die;
   encapsulating the semiconductor die and portions of the plurality of leads with a resin encapsulating material to form a package body which completely contains the first portions, intermediate portions, and second portions of the leads such that a first surface of each of the second portions of the leads and an entire surface of the die receiving area are exposed on, and substantially flush with, one of either a top surface or a bottom surface of the package body; and
   severing the plurality leads to create a second surface of each of the second portions of the leads which is exposed on, and substantially flush with, a side of the package to form the leadless semiconductor device in which only the first and second surfaces of the leads are exposed.

10. The method of claim 9 further comprising the step of attaching the semiconductor device to a substrate by soldering the exposed second portions of the leads on the bottom of the package body to the substrate.

11. A method for fabricating a leadless semiconductor device comprising the steps of:
   providing a semiconductor die;
   providing a leadframe having a plurality of leads, each of the leads having first and second portions and an intermediate portion, the first portions of the leads being used for electrical connection to the die, the second portions of the leads being used for electrical connection to the device, and the first and second portions being separated by the intermediate portion;
   electrically coupling the first portions of each of the plurality of leads to the semiconductor die;
   forming a package body from a resin encapsulating material, the package body completely containing the semiconductor die and the first, second, and intermediate portions of the plurality of leads such that a first surface of each of the second portions of the leads is exposed on, and substantially flush with, either a top surface or a bottom surface of the package body, such that a second surface of each second portion of the leads is exposed on, and substantially flush with a side of the package body, and such that only the first and second surfaces of the leads are exposed; and plating the first and second exposed surfaces of the second portions of the leads with a conductive material.

12. The method of claim 11 wherein the step of plating the exposed areas of the second portions of the leads with a conductive material comprises plating the exposed areas of the second portions of the leads with solder.

* * * * *

UNITED STATES PATENT AND TRADEMARK OFFICE
CERTIFICATE OF CORRECTION

PATENT NO. : 5,172,214

DATED : December 15, 1992

INVENTOR(S) : James J. Casto

It is certified that error appears in the above-identified patent and that said Letters Patent is hereby corrected as shown below:

In claim 1, column 5, line 36:
    after "package body" insert --wherein a second surface of each of the second portions of the leads is exposed on and substantially flush with the perimeter of the package body, and wherein only the first and second surfaces of the second portions of the leads are exposed--;

Cancel claim 2;

In claim 5, column 5, line 65:
    after "second surfaces" insert --of the second portions--;

In claim 9, column 6, line 38:
    after "second surfaces" insert --of the second portions--; and In claim 11, column 6, line 67:
    after "second surfaces" insert --of the second portions--.

On title page, "12 Claims, 1 Drawing Sheet" should read

--11 Claims, 1 Drawing Sheet--

Signed and Sealed this

Sixteenth Day of November, 1993

*Attest:*

BRUCE LEHMAN

*Attesting Officer*      *Commissioner of Patents and Trademarks*